US 9,336,988 B2

(12) United States Patent
Nakayamada

(10) Patent No.: US 9,336,988 B2
(45) Date of Patent: May 10, 2016

(54) MULTI CHARGED PARTICLE BEAM WRITING APPARATUS, AND MULTI CHARGED PARTICLE BEAM WRITING METHOD

(71) Applicant: NuFlare Technology, Inc., Yokohama (JP)

(72) Inventor: Noriaki Nakayamada, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/587,525

(22) Filed: Dec. 31, 2014

(65) Prior Publication Data

US 2015/0206709 A1    Jul. 23, 2015

(30) Foreign Application Priority Data

Jan. 22, 2014    (JP) ................................ 2014-009591

(51) Int. Cl.
*G21K 5/04*    (2006.01)
*H01J 37/304*    (2006.01)
*H01J 37/317*    (2006.01)

(52) U.S. Cl.
CPC ......... *H01J 37/3045* (2013.01); *H01J 37/3177* (2013.01); *H01J 2237/30472* (2013.01)

(58) Field of Classification Search
USPC .......... 250/396 R, 397, 492.1, 492.2, 492.21, 250/492.22, 492.23, 492.3
See application file for complete search history.

(56) References Cited

U.S. PATENT DOCUMENTS

| 7,652,271 | B2 | 1/2010 | Wake et al. | |
|---|---|---|---|---|
| 8,129,698 | B2 | 3/2012 | Nakayamada et al. | |
| 8,502,175 | B2 | 8/2013 | Nakayamada et al. | |
| 2007/0170374 | A1* | 7/2007 | Iijima | B82Y 10/00 250/492.2 |
| 2010/0133433 | A1* | 6/2010 | Tanimoto | H01J 37/244 250/310 |
| 2014/0346349 | A1* | 11/2014 | Nishimura | H01J 37/20 250/307 |
| 2015/0155138 | A1* | 6/2015 | Yoshikawa | H01J 37/3177 250/492.22 |

FOREIGN PATENT DOCUMENTS

| JP | 2002-158167 | 5/2002 |
|---|---|---|
| JP | 2007-324175 | 12/2007 |
| JP | 5063035 | 10/2012 |
| JP | 5480496 | 4/2014 |
| JP | 5525936 | 6/2014 |

* cited by examiner

*Primary Examiner* — Nicole Ippolito
(74) *Attorney, Agent, or Firm* — Oblon, McClelland, Maier & Neustadt, L.L.P.

(57) ABSTRACT

A multi charged particle beam writing apparatus includes a charge amount distribution calculation unit to calculate a charge amount distribution whose charge amount charged by perpendicular incidence of a representative beam of multiple beams in a writing region of a target object, a position correction unit to calculate, using the charge amount distribution, a corrected position of an irradiation position of each beam where a positional deviation amount including a positional deviation amount of an irradiation position due to a charge amount, dependent on the irradiation position of each beam of the multiple beams has been corrected, and a writing unit to write a pattern on the target object by controlling an irradiation amount of each beam such that a formation position of an irradiation pattern of each beam of the multiple beams is to be a corresponding corrected position.

11 Claims, 12 Drawing Sheets

| Value of i | t = 1 | 2 | 3 | 4 | ... | M |
|---|---|---|---|---|---|---|
| k = 1 | 3 | -- | -- | -- | | -- |
| 2 | 3 | 3 | -- | -- | | -- |
| 3 | 2 | 3 | 3 | -- | | -- |
| 4 | 2 | 2 | 3 | 3 | | -- |
| 5 | 1 | 2 | 2 | 3 | | -- |
| 6 | 1 | 1 | 2 | 2 | | -- |
| 7 | 0 | 1 | 1 | 2 | | -- |
| 8 | 0 | 0 | 1 | 1 | | -- |
| 9 | -- | 0 | 0 | 1 | | -- |
| 10 | -- | -- | 0 | 0 | | -- |
| 11 | -- | -- | -- | 0 | | -- |
| ... ... | | | | | | |
| M+m-8 | -- | -- | -- | -- | | 3 |
| M+m-7 | -- | -- | -- | -- | | 3 |
| M+m-6 | -- | -- | -- | -- | | 2 |
| M+m-5 | -- | -- | -- | -- | | 2 |
| M+m-4 | -- | -- | -- | -- | | 1 |
| M+m-3 | -- | -- | -- | -- | | 1 |
| M+m-2 | -- | -- | -- | -- | | 0 |
| M+m-1 | -- | -- | -- | -- | | 0 |

FIG. 13

MULTI CHARGED PARTICLE BEAM WRITING APPARATUS, AND MULTI CHARGED PARTICLE BEAM WRITING METHOD

CROSS-REFERENCE TO RELATED APPLICATION

This application is based upon and claims the benefit of priority from the prior Japanese Patent Application No. 2014-009591 filed on Jan. 22, 2014 in Japan, the entire contents of which are incorporated herein by reference.

BACKGROUND OF THE INVENTION

1. Field of the Invention

The present invention relates to a multi charged particle beam writing apparatus and a multi charged particle beam writing method. More specifically, the present invention relates to a multi beam writing apparatus and method capable of correcting a positional deviation due to the amount of charge (electrification) when a pattern is written onto a target object using multi electron beams, for example.

2. Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer and the like with electron beams.

As an example employing the electron beam writing technique, a writing apparatus using multiple beams (multi-beams) can be cited. Compared with the case of writing a pattern by using a single electron beam, since it is possible to emit multiple beams at a time in multiple writing, the throughput can be greatly increased. For example, in the writing apparatus employing a multi-beam system, multiple beams are formed by letting an electron beam emitted from an electron gun assembly pass through a mask with a plurality of holes, blanking control is performed for each of the beams, and each unblocked beam is reduced by an optical system and deflected by a deflector so as to irradiate a desired position on a target object or "sample".

When a target object, such as a mask, to which a resist film has been applied, is irradiated with multiple beams, the irradiated position and its periphery may have been charged with multiple beams previously irradiated. The positional deviation due to this charging phenomenon has not been conventionally regarded as a problem in the multi beam writing apparatus. However, with the pattern miniaturization as described above, such positional deviation due to the charging phenomenon has become a problem. In particular, improvement of the pattern position accuracy of photomasks is required more than ever because a double patterning technique has been introduced.

Conventionally, as a method for correcting a positional deviation of a position irradiated by the beams, with respect to a single beam writing system, there has been known to form a charge dissipation layer (CDL) on a resist layer in order to prevent charging of the resist surface. However, since the charge dissipation layer basically has acidic properties, it has a poor affinity for a chemically amplified resist. Further, there is a need to provide new equipment in order to form the charge dissipation layer, thereby increasing the manufacturing cost of a photomask. For this reason, it is desired to perform charging effect correction (CEC) without using the charge dissipation layer.

With regard to a positional deviation correction amount caused by charging, as to a single beam writing system, there is proposed a writing apparatus which calculates a correction amount of positional deviation of a beam irradiation position, based on an electric field strength, and applies a beam based on the correction amount (refer to, e.g., Japanese Patent Application Laid-open (JP-A) No. 2007-324175). According to such a writing apparatus, a positional deviation amount distribution is calculated from an irradiation amount distribution through a linear response function assuming that there exists a linearly proportional relationship between the irradiation amount distribution and a charge amount distribution.

With respect to a multi beam writing system, since irradiation is simultaneously performed with multiple beams at a time, it needs to consider the influence from the surrounding beam. Thereby, it is assumed that a further device different from that of a single beam system is required. However, with respect to a multi beam writing system, a method for exactly correcting a positional deviation of the irradiation position due to the electrification phenomenon has not been conventionally established.

BRIEF SUMMARY OF THE INVENTION

According to one aspect of the present invention, a multi charged particle beam writing apparatus includes a charge amount distribution calculation unit configured to calculate a charge amount distribution whose charge amount charged by perpendicular incidence of a representative beam of multiple beams in a writing region of a target object, a position correction unit configured to calculate, using the charge amount distribution, a corrected position of an irradiation position of each beam where a positional deviation amount including a positional deviation amount of an irradiation position due to a charge amount, dependent on the irradiation position of the each beam of the multiple beams has been corrected, and a writing unit configured to write a pattern on the target object by controlling an irradiation amount of the each beam such that a formation position of an irradiation pattern of the each beam of the multiple beams is to be a corresponding corrected position.

According to another aspect of the present invention, a multi charged particle beam writing method includes calculating a charge amount distribution whose charge amount charged by perpendicular incidence of a representative beam of multiple beams in a writing region of a target object, calculating, using the charge amount distribution, a corrected position of each irradiation position where a positional deviation amount including a positional deviation amount of an irradiation position due to a charge amount, dependent on the irradiation position of the each beam of the multiple beams has been corrected, and writing a pattern on the target object by controlling an irradiation amount of the each beam such that a formation position of an irradiation pattern of the each beam of the multiple beams is to be a corresponding corrected position.

BRIEF DESCRIPTION OF THE DRAWINGS

FIG. 13 shows examples of a multi-beam block-division number corresponding to a tracking block number and a tracking times number according to the first embodiment.

DETAILED DESCRIPTION OF THE INVENTION

In the following embodiments, there will be described an apparatus and method for correcting a positional deviation of an irradiation position due to the amount of charge in multi beam writing.

Moreover, in the following embodiments, there will be described a configuration in which an electron beam is used as an example of a charged particle beam. The charged particle beam is not limited to the electron beam, and other charged particle beam such as an ion beam may also be used.

First Embodiment

Figure 1:
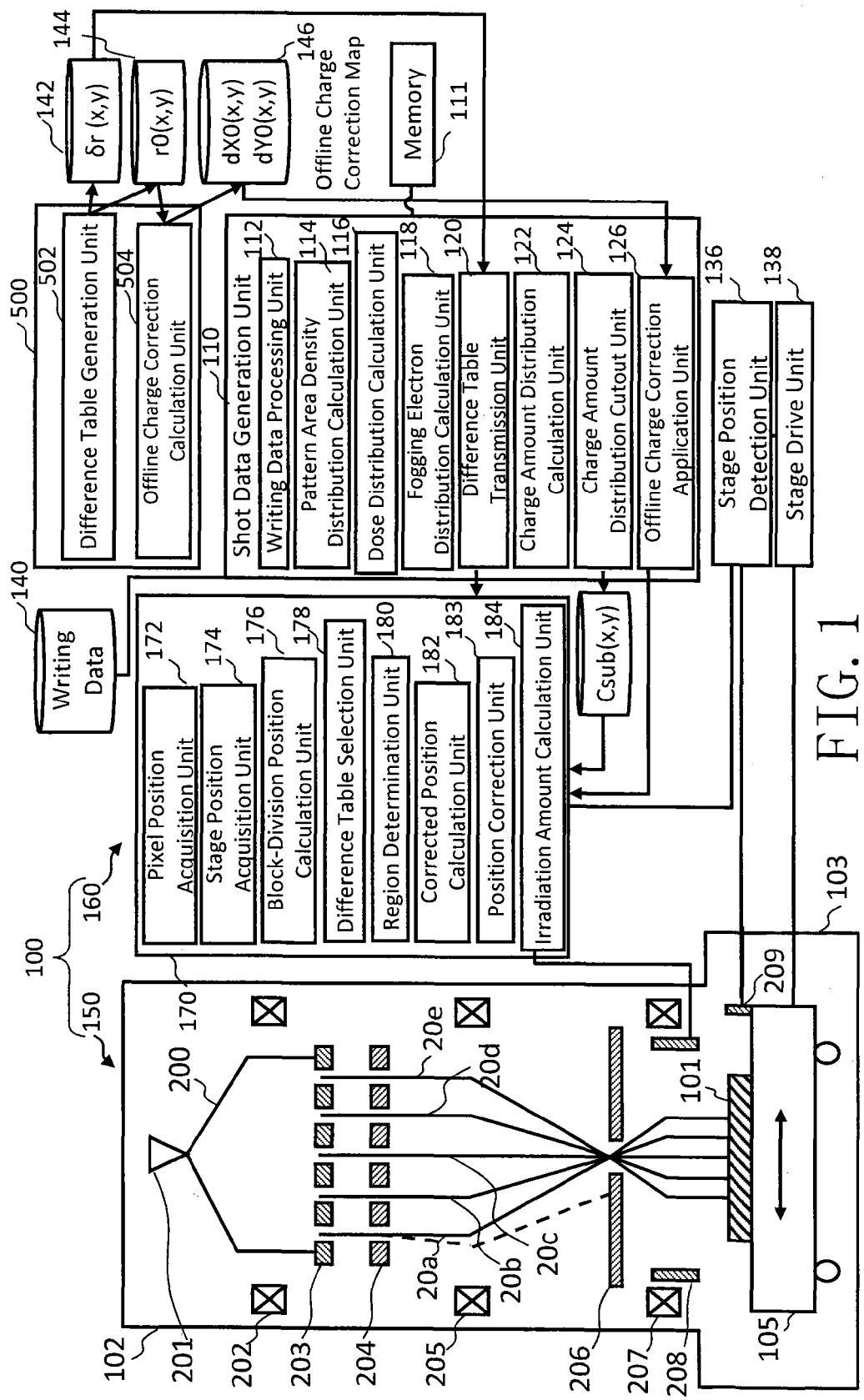
FIG. 1 is a schematic diagram showing a configuration of a writing apparatus according to a first embodiment.

FIG. 1 is a schematic diagram showing a configuration of a writing or "drawing" apparatus according to the first embodiment. In FIG. 1, a writing apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun assembly 201, an illumination lens 202, an aperture member 203 (or "shaping aperture membrane 203"), a blanking plate 204, a reducing lens 205, a limiting aperture member 206 (or "limiting aperture membrane 206"), an objective lens 207, and a deflector 208. In the writing chamber 103, there is arranged an XY stage 105. On the XY stage 105, there is placed a target object or "sample" 101 such as a mask serving as a writing target substrate when writing is performed. The target object 101 is, for example, an exposure mask used for manufacturing semiconductor devices, or is a semiconductor substrate (silicon wafer) on which semiconductor elements are formed. The target object 101 may be, for example, a mask blank on which resist is applied and a pattern has not yet been formed. On the XY stage 105, further, there is arranged a mirror 209 for measuring the position of the XY stage.

The control unit 160 includes a control computer 110, a memory 111, a stage position detection unit 136, a stage drive unit 138, a deflection control circuit 170, and storage devices 140, 142, 144, and 146 such as magnetic disk drives. The control computer 110, the memory 111, the stage position detection unit 136, the stage drive unit 138, the deflection control circuit 170, and the storage devices 140, 142, 144, and 146 are connected with each other through a bus (not shown). The deflection control circuit 170 is connected to the deflector 208.

In the control computer 110, there are provided functions, such as a writing data processing unit 112, a pattern area density distribution calculation unit 114, a dose distribution calculation unit 116, a fogging electron distribution calculation unit 118, a difference table transmission unit 120, a charge amount distribution calculation unit 122, a charge amount distribution cutout unit 124, and an offline charge correction application unit 126. These functions may be configured by hardware such as an electric circuit, or processing contents of these functions may be configured by a program (software) causing a computer to implement these functions. Alternatively, they may be configured by a combination of hardware and software, or by a combination of hardware and firmware. Data which is input into the control computer 110, or data being arithmetically processed or having been processed is stored in the memory 111 each time.

In the deflection control circuit 170, there are provided functions, such as a pixel position acquisition unit 172, a stage position acquisition unit 174, a block-division position calculation unit 176, a difference table selection unit 178, a region determination unit 180, a corrected position calculation unit 182, a position correction unit 183, and an irradiation amount calculation unit 184. These functions may be configured by hardware such as an electric circuit, or processing contents of these functions may be configured by a program (software) causing a computer to implement these functions. Alternatively, they may be configured by a combination of hardware and software, or by a combination of hardware and firmware. Data which is input into the deflection control circuit 170, or data being arithmetically processed or having been processed is stored in the memory (not shown) each time.

Moreover, in an external computer 500 of the writing apparatus 100, there are provided functions such as a difference table generation unit 502 and an offline charge correction calculation unit 504. These functions may be configured by hardware such as an electric circuit, or processing contents of these functions may be configured by a program (software) causing a computer to implement these functions. Alternatively, they may be configured by a combination of hardware and software, or by a combination of hardware and firmware.

FIG. 1 shows only a configuration needed for describing the first embodiment. It should be understood that other configuration elements generally necessary for the writing apparatus 100 are also included therein.

In FIG. 1, holes (openings) of a plurality of rows long (y direction) and a plurality of columns wide (x direction) are formed, like a matrix, in the aperture member 203 at a predetermined arrangement pitch on the horizontal surface. For example, holes of 512 (rows)×512 (columns) are formed. Each of the holes is a quadrangle of the same dimensions and shape. Alternatively, each of the holes can be a circle of the same circumference. Multiple beams 20 are formed by letting portions of an electron beam 200 respectively pass through a corresponding hole of these plurality of holes. The case in which the holes of two or more rows and columns are arranged in both the x and the y directions is shown here, but the arrangement is not limited thereto. For example, it is also acceptable that a plurality of holes are arranged in only one row (x direction) or in only one column (y direction). That is, in the case of only one row, a plurality of holes are arranged as a plurality of columns, and in the case of only one column, a plurality of holes are arranged as a plurality of rows. The method of arranging the holes is not limited to the case where holes are arranged like a grid in the length and width directions. For example, as to the first and second rows arrayed in the length direction (y direction), each hole in the first row and each hole in the second row may be mutually displaced in the width direction (x direction) by a dimension "a". Similarly, as to the second and third rows arrayed in the length direction (y direction), each hole in the second row and each hole in the third row may be mutually displaced in the width direction (x direction) by a dimension "b".

The electron beam 200 emitted from the electron gun assembly 201 (emission unit) almost perpendicularly (for example, vertically) illuminates the whole of the aperture member 203 by the illumination lens 202. The region including all the plurality of holes formed in the aperture member 203 is irradiated by the electron beam 200. For example, a plurality of quadrangular electron beams (multiple beams) 20a to 20e are formed by letting parts of the electron beam 200 irradiating the positions of a plurality of holes respectively pass through a corresponding hole of the plurality of holes of the aperture member 203. The multiple beams 20a to 20e respectively pass through a corresponding blanker (first deflector: individual blanking system) of the blanking plate 204. Each blanker respectively deflects (performs blanking deflection) the electron beam 20 passing individually.

The multiple beams 20a, 20b, . . . , 20e, having passed through the blanking plate 204 are reduced by the reducing lens 205, and go toward the hole at the center of the limiting aperture member 206. At this stage, the electron beam 20 which was deflected by the blanker of the blanking plate 204 deviates from the hole of the center of the limiting aperture member 206 (blanking aperture member) and is blocked by the limiting aperture member 206. On the other hand, the electron beam 20 which was not deflected by the blanker of the blanking plate 204 passes through the hole at the center of the limiting aperture member 206 as shown in FIG. 1. Blanking control is performed by ON/OFF of the individual blanking system so as to control ON/OFF of the beam. Thus, the limiting aperture member 206 blocks each beam which was deflected to be a beam OFF state by the individual blanking system. Then, one beam shot is formed by beams having been made during from a beam ON state to a beam OFF state and having passed through the limiting aperture member 206. The multiple beams 20 having passed through the limiting aperture member 206 are focused by the objective lens 207 in order to be a pattern image of a desired reduction ratio, and respective beams (the entire multiple beams 20) having passed through the limiting aperture member 206 are collectively deflected in the same direction by the deflector 208 so as to irradiate respective beam irradiation positions on the target object 101. While the XY stage 105 is continuously moving, controlling is performed by the deflector 208 so that irradiation positions of beams may follow the movement of the XY stage 105, for example. The position of the XY stage 105 is measured by using a reflected light which is obtained by irradiating a laser onto the mirror 209 on the XY stage 105 from the stage position detection unit 136. Ideally, multiple beams 20 to irradiate at a time are aligned at pitches obtained by multiplying the arrangement pitch of a plurality of holes of the aperture member 203 by a desired reduction ratio described above. The writing apparatus 100 performs a writing operation by the raster scan method which continuously irradiates shot beams in order, and when writing a desired pattern, a required beam is controlled by blanking control to be ON according to the pattern.

The XY stage 105 is drive-controlled by the stage drive unit 138. The position of the XY stage 105 is detected by the stage position detection unit 136. The stage position detection unit 136 includes a laser measurement device that emits lasers to the mirror 209 and measures a position based on the laser reflected light, for example.

Figure 2:
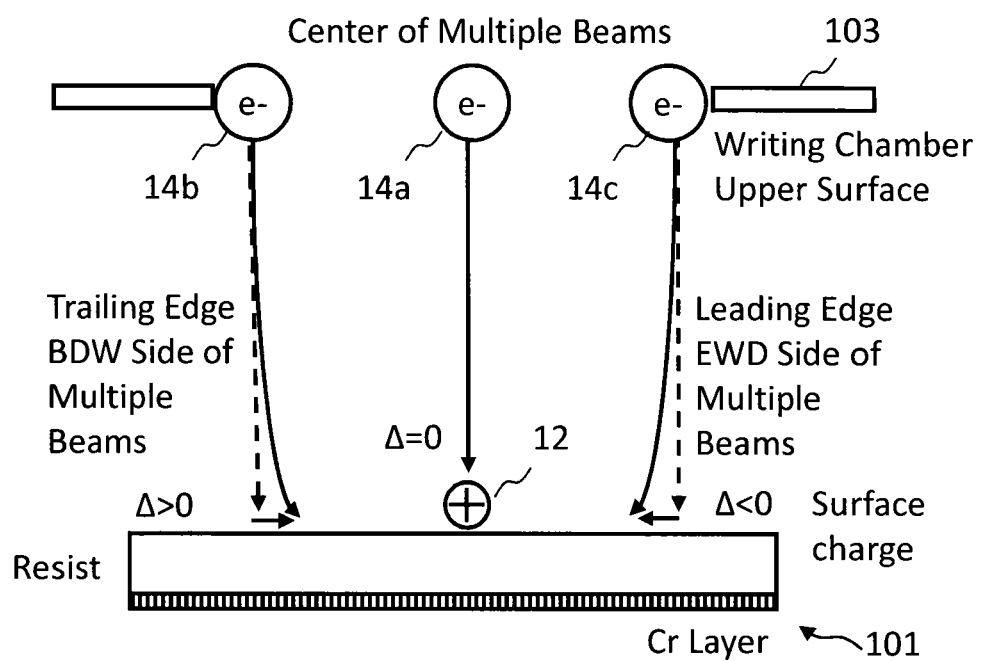
FIG. 2 illustrates a positional deviation due to the amount of charge according to the first embodiment.

FIG. 2 illustrates a positional deviation due to the amount of charge according to the first embodiment. In FIG. 2, when a positive point charge 12 of 1 nC exists on the surface of the target object 101, negatively-charged electrons 14 each being each beam of multi beams simultaneously emitted from the upper part of the writing chamber 103 are attracted by the point charge 12. An electron 14a which enters the point charge 12 from just above is attracted perpendicularly. By contrast, electrons 14b and 14c perpendicularly enter the point charge 12 from the positions shifted from the position just above the point charge 12, and therefore, their orbits are displaced because of being attracted by the point charge. Thus, in the multiple beams, positional deviation dependent on an irradiation position occurs.

Figure 3:
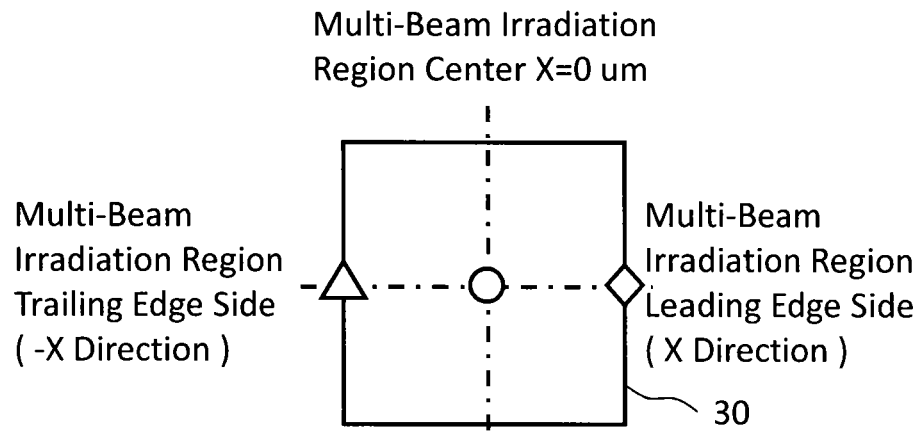
FIG. 3 shows an example of the positional relation of multi-beam irradiation regions according to the first embodiment.

FIG. 3 shows an example of the positional relation of multi-beam irradiation regions according to the first embodiment. In FIG. 3, the center position of the irradiation region (multi-beam irradiation region) of the entire multiple beams emitted at a time is denoted by a circular symbol (○), the leading edge position (+x direction) by a square symbol (◇), and the trailing edge position (−x direction) by a triangle (Δ).

Figure 4:
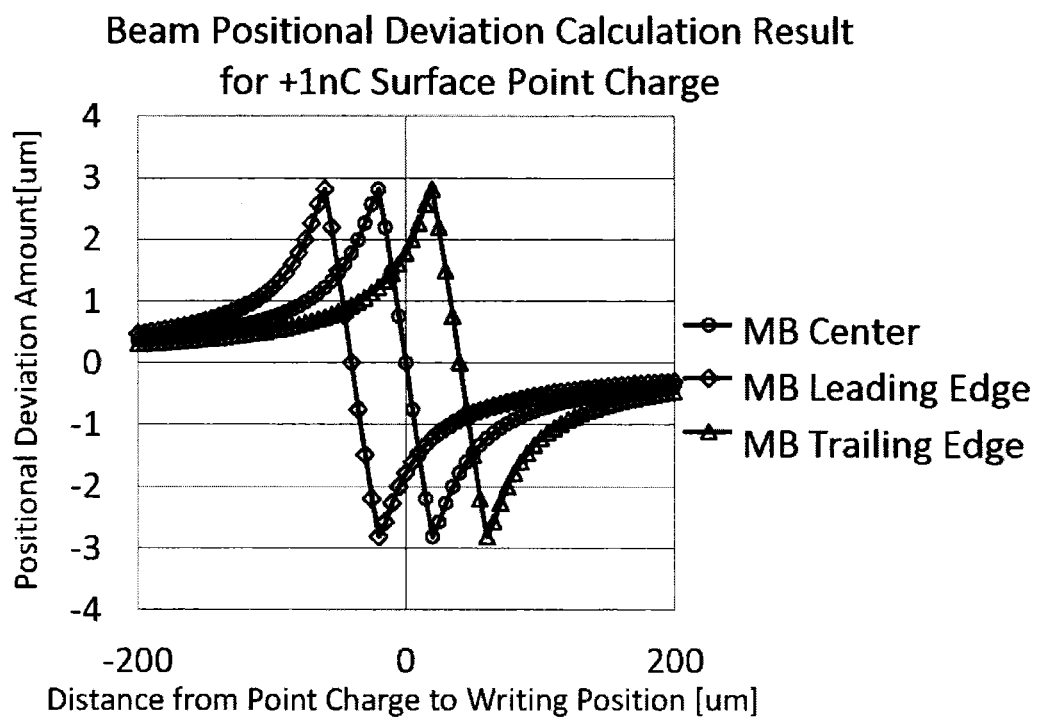
FIG. 4 is a graph showing, by superimposing, a positional deviation amount for perpendicular incidence at the center position of a multi-beam irradiation region, a positional deviation amount for perpendicular incidence at the leading edge position of the multi-beam irradiation region, and a positional deviation amount for perpendicular incidence at the trailing edge position of the multi-beam irradiation region according to the first embodiment.

FIG. 4 is a graph showing, by superimposing, a positional deviation amount for perpendicular incidence at the center position of a multi-beam irradiation region, a positional deviation amount for perpendicular incidence at the leading edge position of the multi-beam irradiation region, and a positional deviation amount for perpendicular incidence at the trailing edge position of the multi-beam irradiation region according to the first embodiment. As shown in FIG. 4, in the case of multiple beams, there is a great difference of the positional deviation amount depending upon an irradiation position (leading edge position, center position, and trailing edge position). In other words, the irradiation position dependence property is large.

Figure 5:
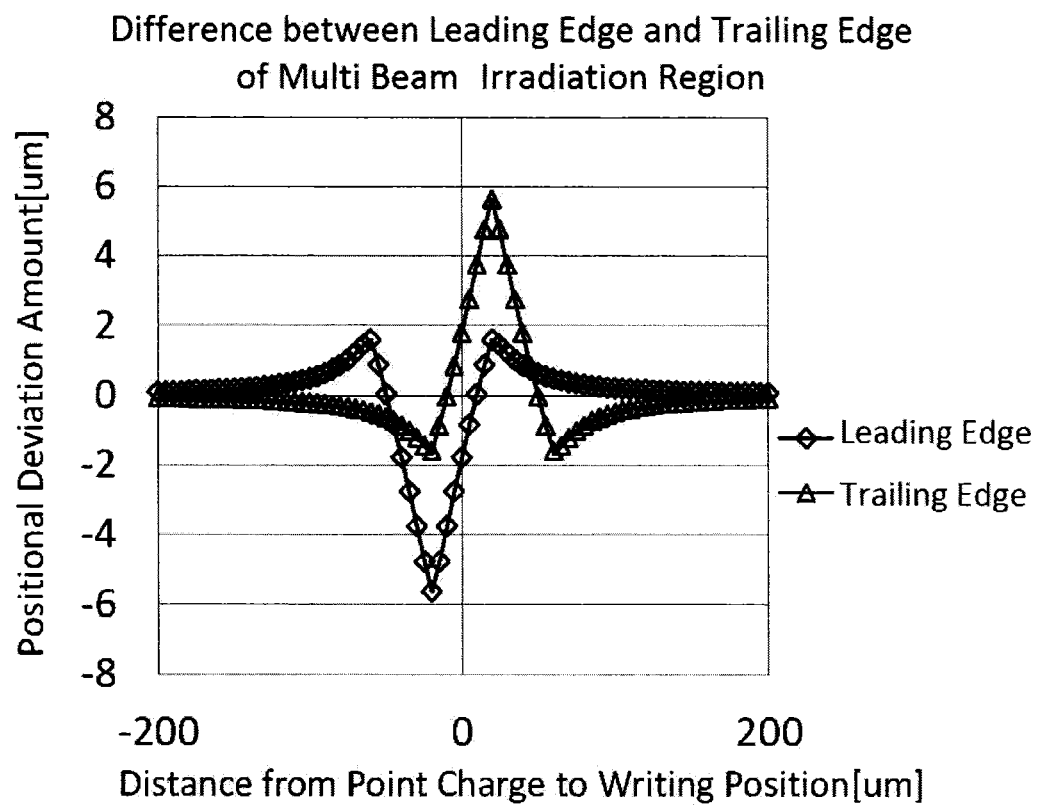
FIG. 5 is an example of a graph showing a difference between a positional deviation amount for perpendicular incidence at the center position of a multi-beam irradiation region and a positional deviation amount for perpendicular incidence at each irradiation position (the leading edge position and the trailing edge position) of the multi-beam irradiation region according to the first embodiment.

FIG. 5 is an example of a graph showing a difference between a positional deviation amount for perpendicular incidence at the center position of a multi-beam irradiation region and a positional deviation amount for perpendicular incidence at each irradiation position (the leading edge position and the trailing edge position) of the multi-beam irradiation region according to the first embodiment. In the graph shown in FIG. 5, the ordinate axis is twice the length of that of FIG. 4. As shown in FIG. 5, there is a difference of the amount, in the multi-beam irradiation region, between the positional deviation amount for perpendicular incidence at the center position and the positional deviation amount for perpendicular incidence at each irradiation position (the leading edge position and the trailing edge position). That is, it is evident that, in a positional deviation amount due to the charge amount, there exists a positional deviation amount dependent upon the irradiation position in addition to a positional deviation amount for perpendicular incidence at the center position. For example, the positional deviation amount dependent upon an irradiation position in multiple beams is 100 times or more the amount of a positional deviation amount dependent upon a main deflection position (the leading edge position and the trailing edge position) in a single beam. Therefore, in multi-beam writing, the effect of correcting such a positional deviation amount is greatly larger than that in single beam writing.

Figure 6:
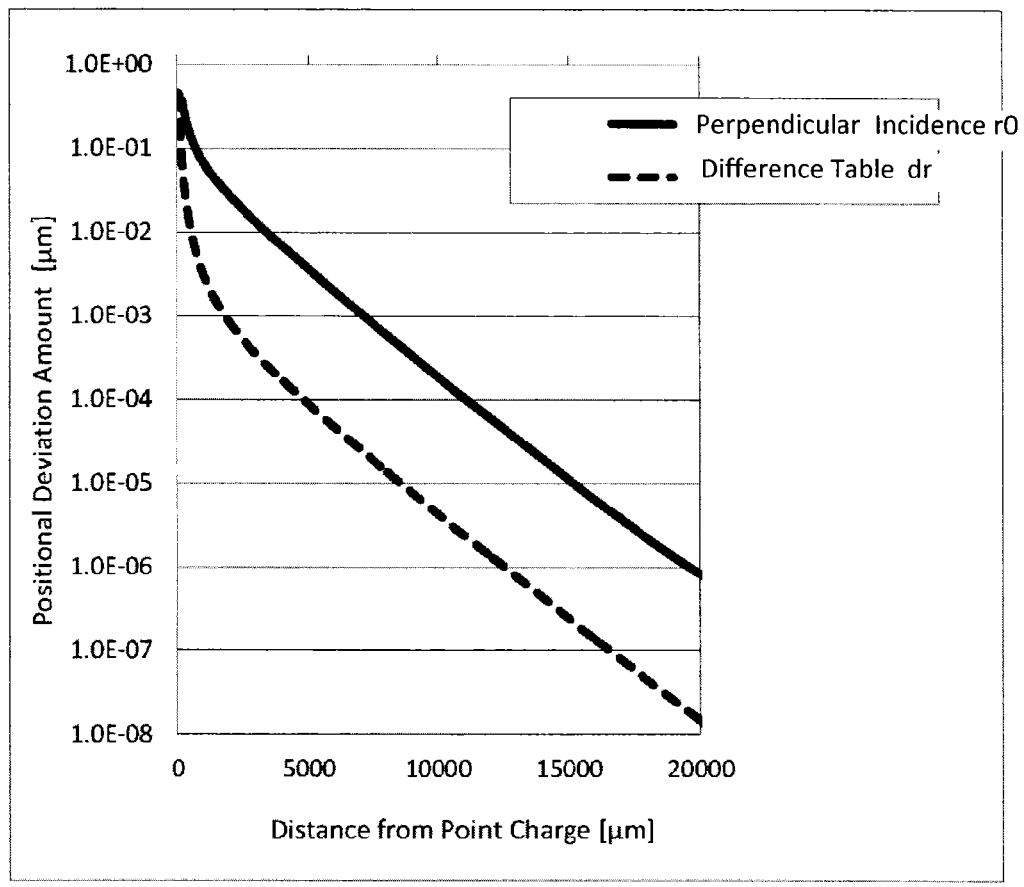
FIG. 6 is an example of a graph showing a positional deviation amount for perpendicular incidence at the center position of a multi-beam irradiation region, and a difference obtained by subtracting a positional deviation amount for perpendicular incidence at each irradiation position (the leading edge position and the trailing edge position) in a multi-beam irradiation region from a positional deviation amount for perpendicular incidence at the center position of the multi-beam irradiation region according to the first embodiment.

FIG. 6 is an example of a graph showing a positional deviation amount for perpendicular incidence at the center position of a multi-beam irradiation region, and a difference obtained by subtracting a positional deviation amount for perpendicular incidence at each irradiation position (the leading edge position and the trailing edge position) in the multi-beam irradiation region from a positional deviation amount for perpendicular incidence at the center position of the multi-beam irradiation region in the first embodiment. In FIG. 6, the abscissa axis represents a distance from the point charge to the writing position, and the ordinate axis represents a positional deviation amount. For example, supposing that the range for correcting a positional deviation amount is $1 \times 10^{-6}$ µm or more, the calculation range (influence range) from the charging position in the case of calculating a positional deviation amount for perpendicular incidence at the center position needs to be 20 mm. By contrast, in the case of calculating a difference by subtracting a positional deviation amount for perpendicular incidence at each irradiation position (the leading edge position and the trailing edge position) in a multi-beam irradiation region from a positional deviation amount for perpendicular incidence at the center position of the multi-beam irradiation region, the range for correcting a positional deviation amount needs to be about 13.5 mm. That is, the calculation range (influence range) from the charging position can be made narrower when calculating a difference by subtracting a positional deviation amount for perpendicular incidence at each irradiation position (the leading edge position and the trailing edge position) in a multi-beam irradiation region from a positional deviation amount for perpendicular incidence at the center position than when calculating a positional deviation amount for perpendicular incidence at the center position of the multi-beam irradiation region. Since the calculation time is proportional to the square (second power) of the calculation range, it is possible to make the calculation time be 45.5% by calculating the difference, instead of calculating a positional deviation amount for perpendicular incidence in the writing apparatus 100. Consequently, the calculation time can be reduced. Therefore, correction calculation can be performed in real time with writing processing. If making the threshold value of the range for correcting a positional deviation further narrower, it is possible to perform the calculation further faster. According to the first embodiment, a correction value which corrects a positional deviation amount for perpendicular incidence in the center position of the multi-beam irradiation region is calculated in advance before starting writing, and, then, a correction value which corrects a difference is calculated in real time with writing processing in the writing apparatus 100. By adding both the correction values, a positional deviation amount can be corrected taking irradiation positions of multiple beams into consideration. In the first embodiment, since correction calculation of a positional deviation is performed without requiring measurement information on an actual charge amount distribution on the target object 101, a correction cycle period is determined by the calculation speeds of the charge amount distribution calculation unit 122 and the deflection control circuit 170. Therefore, in order to perform the correction calculation in real time with writing processing, correction with a period of a stage tracking unit is practicable. As to a concrete time cycle period, correction with a period from several µs to several hundreds of µs is practicable.

In addition, in multi-beam writing, since which irradiation position (pixel) is irradiated with which beam has already been determined before staring writing processing, it may not be necessary to perform correction calculation in real time with writing processing.

Although the center position of the multi-beam irradiation region is regarded as a representative position in the example described above, it is not limited thereto. The representative position may be a position other than the center position of a multi-beam irradiation region.

Figure 7:
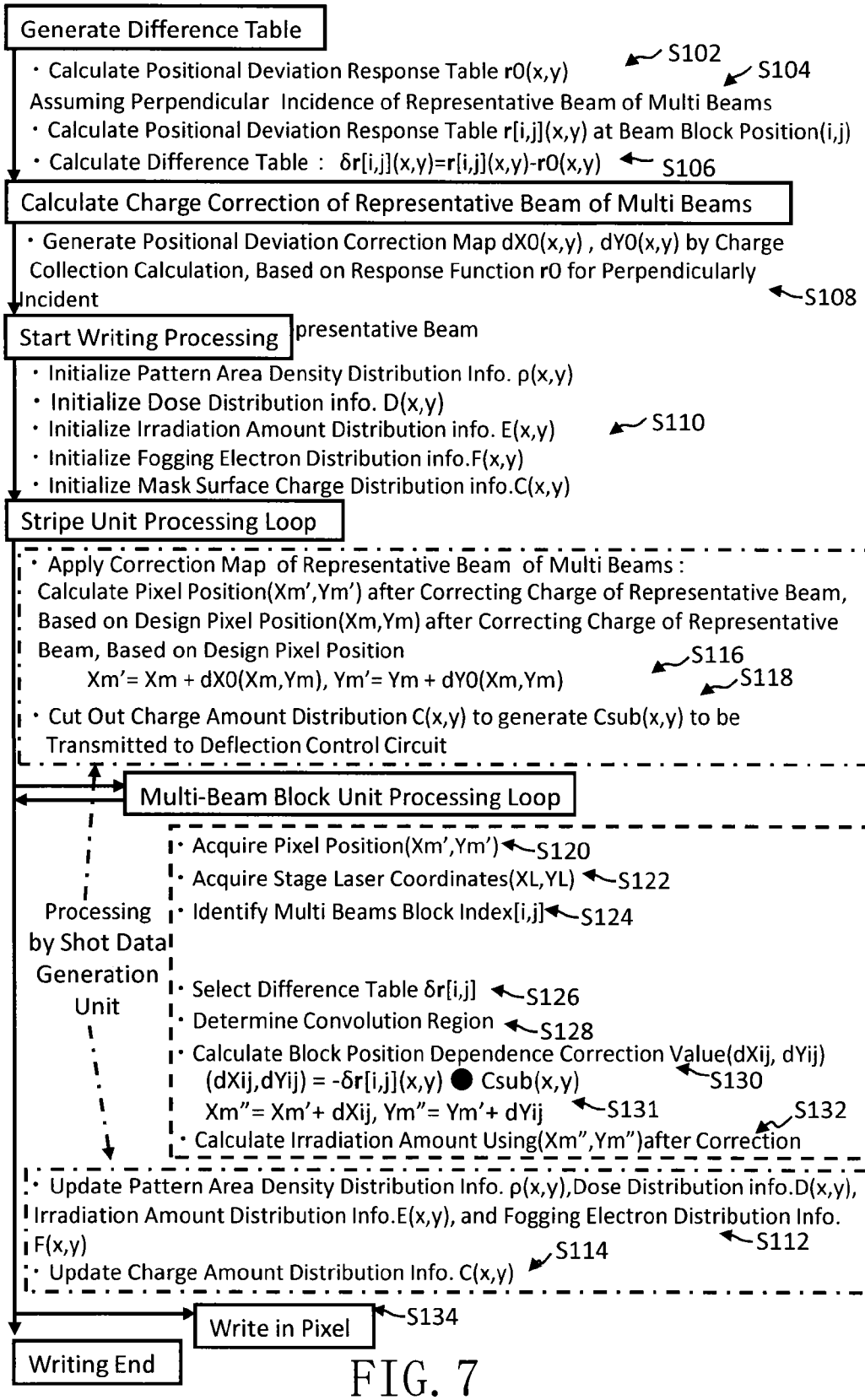
FIG. 7 is a flowchart showing main steps of a writing method according to the first embodiment.

FIG. 7 is a flowchart showing main steps of a writing method according to the first embodiment. In FIG. 7, as preparations, a series of steps, such as a positional deviation response table calculation step (S102) for perpendicular incidence of a representative beam of multiple beams, a positional deviation response table calculation step (S104) in accordance with a beam block-division position, a difference table calculation step (S106), and a positional deviation correction value calculation step (S108) for perpendicular incidence of a representative beam of multiple beams is performed in the external computer 500.

In the writing apparatus 100, there is performed a series of steps, such as an initialization step (S110), a calculation step (S112) to calculate a pattern area density distribution, dose (irradiation amount density) distribution, irradiation amount distribution and fogging electron distribution, a charge amount distribution calculation step (S114), a pixel position correction step (S116) for perpendicular incidence of a representative beam, a charge amount distribution cutout step (S118), a pixel corrected position acquisition step (S120) for perpendicular incidence of a representative beam, a stage position acquisition step (S122), a multi-beam block-division position identification step (S124), a difference table selection step (S126), a calculation region determination step (S128), a block position dependence correction value calculation step (S130), a position correction step (S131), an irradiation amount calculation step (S132), and a pixel writing step (S134).

In the positional deviation response table calculation step (S102) for perpendicular incidence of a representative beam of multiple beams, the difference table generation unit 502 calculates a response function (second response function) that calculates a positional deviation amount (second positional deviation amount) at each irradiation position of a multi-beam irradiation region due to a charge amount, resulting from perpendicular incidence of a representative beam (for example, a beam irradiating a substantial center position of a multi-beam irradiation region: central beam) of multiple beams. In other words, the difference table generation unit 502 calculates a positional deviation response table $r0(x, y)$ assuming an electron which is perpendicularly incident at the representative position (representative beam position) of the multi-beam irradiation region, and stores the table in the storage device 144. The positional deviation response table r0(x, y) is an example of the response function (second response function). The positional deviation response table r0(x, y) may be calculated by another function or a user, instead of being generated by the difference table generation unit 502. The positional deviation amount can be obtained by convolving the response function with the charge amount distribution. Therefore, the positional deviation response table r0(x, y) can be obtained based on calculation of a positional deviation amount of each irradiation position in a multi-beam irradiation region caused by the amount of charge, resulting from perpendicular incidence of a representative beam of multiple beams, and based on calculation of a charge amount distribution.

In the positional deviation response table calculation step (S104) in accordance with a beam block-division position, the difference table generation unit 502 calculates a response function (first response function) that calculates a positional deviation amount (first positional deviation amount) of each block position (i, j) due to the amount of charge at each beam block-division position (i, j) (an example of an irradiation position) of multiple beams. In other words, the difference table generation unit 502 calculates a positional deviation response table r[i, j](x, y) at a block position (i, j) and stores it in the storage device 144. The positional deviation response table r[i, j](x, y) is an example of the response function (first response function). The positional deviation response table r[i, j](x, y) may be calculated by another function or a user, instead of being generated by the difference table generation unit 502. As described above, the positional deviation amount can be obtained by convolving the response function with the charge amount distribution. Therefore, the positional deviation response table r[i, j](x, y) can be obtained based on calculation of a positional deviation amount of each block position due to the amount of charge, generated at each block position (i, j) and based on calculation of a charge amount distribution.

Figure 8:
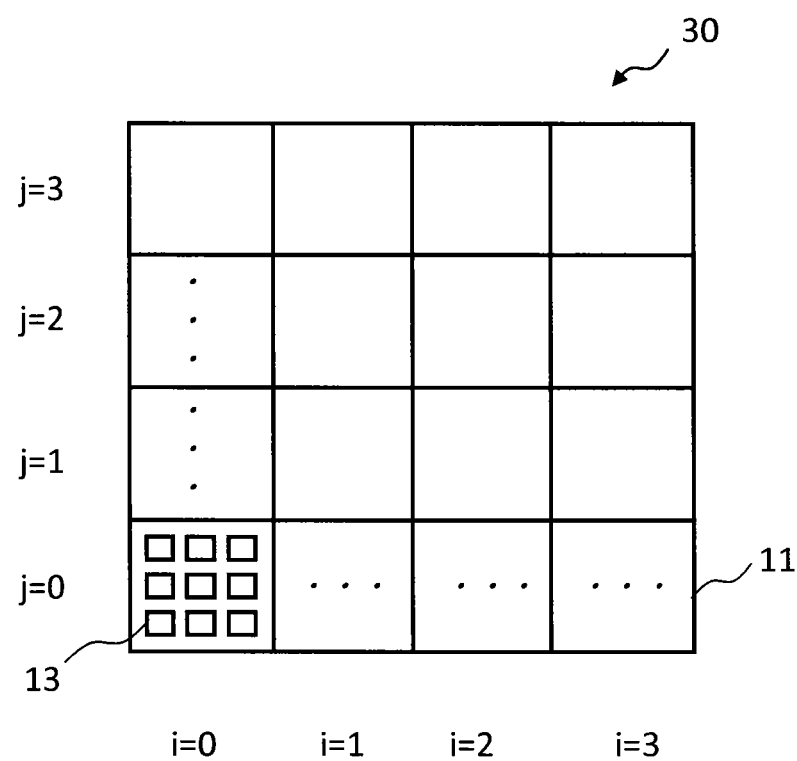
FIG. 8 shows an example of a beam block-division position of multiple beams according to the first embodiment.

FIG. 8 shows an example of a beam block-division position of multiple beams according to the first embodiment. In FIG. 8, a multi-beam irradiation region 30 is divided into a plurality of mesh-like blocks 11 (an example of a plurality of irradiation positions of multiple beams). Each block 11 is irradiated by a plurality of beams 13. For example, when multiple beams are composed of 512×512 beams, it is preferable that each block is defined to be in charge of beams whose number is from several tens to several hundreds. Alternatively, it is also preferable that each block is in charge of a thousand or more beams. According to the first embodiment, correction is performed not for each beam but for each block 11 collectively in charge of several beams, as a practicable method. Of course, it is acceptable to perform correction for each irradiation position for each beam.

In the difference table calculation step (S106), the difference table generation unit 502 calculates a plurality of difference response functions each indicating a difference between the positional deviation response table r[i, j](x, y) at a block position (i, j) and the positional deviation response table r0(x, y) assuming a perpendicularly incident electron at a representative beam position. In other words, the difference table generation unit 502 calculates a difference table δr[i, j](x, y), and stores it in the storage device 142. The difference table δr[i, j](x, y) is an example of the difference response function, and can be obtained by the following equation (1).

$$\delta r[i,j](x,y)=r[i,j](x,y)-r0(x,y) \quad (1)$$

In the examples described above, the positional deviation response table r[i, j](x, y) (first response function) and the positional deviation response table r0(x, y) (second response function) are stored in the storage device 144, and the difference table δr[i, j](x, y) (difference response function) is stored in storage device 142, but it is not limited thereto. It is also preferable to store the positional deviation response table r[i, j](x, y) (first response function), the positional deviation response table r0(x, y) (second response function), and the difference table δr[i, j](x, y) (difference response function) in the same storage device. Alternatively, they may be respectively stored in respective storage devices. Alternatively, it is also preferable to store the positional deviation response table r[i, j](x, y) (first response function) and the difference table δr[i, j](x, y) (difference response function) in the same storage device, and the positional deviation response table r0(x, y) (second response function) in another storage device. Alternatively, it is also preferable to store the positional deviation response table r0(x, y) (second response function) and the difference table δr[i, j](x, y) (difference response function) in the same storage device, and the positional deviation response table r[i, j](x, y) (first response function) in another storage device.

Figure 9:
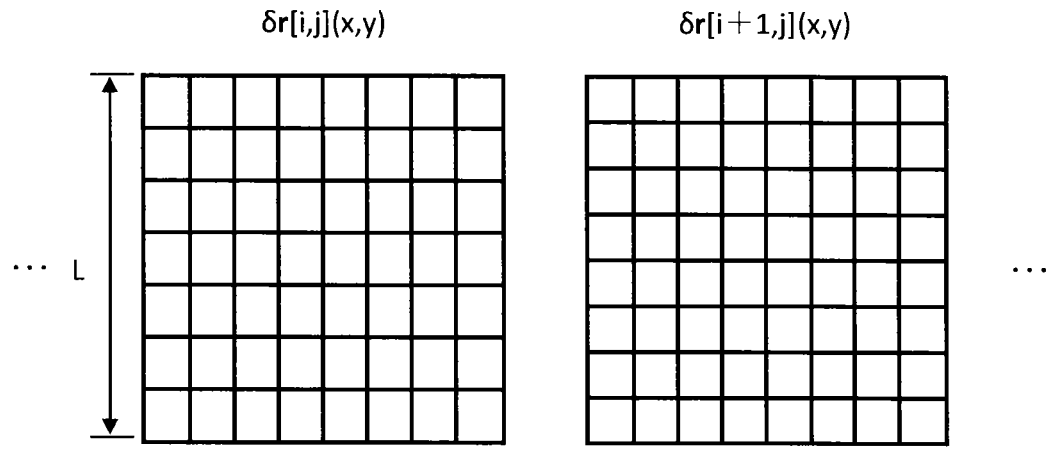
FIG. 9 shows an example of a difference table according to the first embodiment.

FIG. 9 shows an example of a difference table according to the first embodiment. As shown in FIG. 9, a plurality of difference tables δr[i, j](x, y) are prepared in accordance with a block position (i, j), for example. Each difference table δr[i, j](x, y) is stored in the storage device 142. The calculation range of the difference table δr[i, j](x, y) is shown as the range of L×L. As described with reference to FIG. 6, the calculation range can be made narrower by using the difference table δr[i, j](x, y) than that by using the positional deviation response table r0(x, y). For example, in the case of FIG. 6, while the calculation range is 40 mm (=20 mm(radius)×2) when the positional deviation response table r0(x, y) is used, it can be reduced to L=27 mm (=13.5 mm(radius)×2) when the difference table δr[i, j](x, y) is used.

In the positional deviation correction value calculation step (S108) for perpendicular incidence of a representative beam of multiple beams, the offline charge correction calculation unit 504 calculates a positional deviation correction value map dX(x, y), dY(x, y) (or maps dX(x, y) and dY(x, y)), based on the positional deviation response table r0(x, y) which is a response function for a perpendicularly incident representative beam. The correction value map dX(x, y) indicates a correction value in the x direction, and the correction value map dY(x, y) indicates a correction value in the y direction. The correction value maps dX(x, y) and dY(x, y) are stored in the storage device 146. A positional deviation amount can be obtained by calculating a charge amount distribution, and convolving the position deviation response table r0(x, y) with the charge amount distribution. It is preferable to use, as the correction value, a value obtained by inverting the sign (positive/negative) of a positional deviation amount, for example.

In the writing data processing step, the writing data processing unit 112 reads, for each frame region, corresponding layout data from writing data stored in the storage device 140, and generates shot data in a format specific to the writing apparatus by performing data processing of a plurality of steps in the writing apparatus 100.

Then, in the initialization step (S110), the pattern area density distribution calculation unit 114 initializes a pattern area density distribution. The dose distribution calculation unit 116 initializes a dose distribution. The fogging electron distribution calculation unit 118 initializes a fogging electron distribution. The charge amount distribution calculation unit 122 initializes a charge amount distribution. If nothing has been calculated, this step can be omitted.

In the calculation step (S112) to calculate a pattern area density distribution, dose distribution, irradiation amount distribution, and fogging electron distribution, the pattern area density distribution calculation unit 114 calculates a distribution of the pattern area density in each mesh region, for each frame obtained by virtually dividing into meshes by a predetermined dimension, based on figure data included in layout data read from the storage device 140. The dose distribution calculation unit 116 calculates a distribution of a dose amount (irradiation amount density) by using a proximity effect correction equation of a back scattering electron to be described later. The fogging electron distribution calculation unit 118 calculates a distribution of a fogging electron amount, based on distribution of the irradiation amount of an electron beam which is obtained based on a distribution of a pattern area density and a distribution of a dose amount, and a function describing the spread of fogging electrons.

Figure 10:
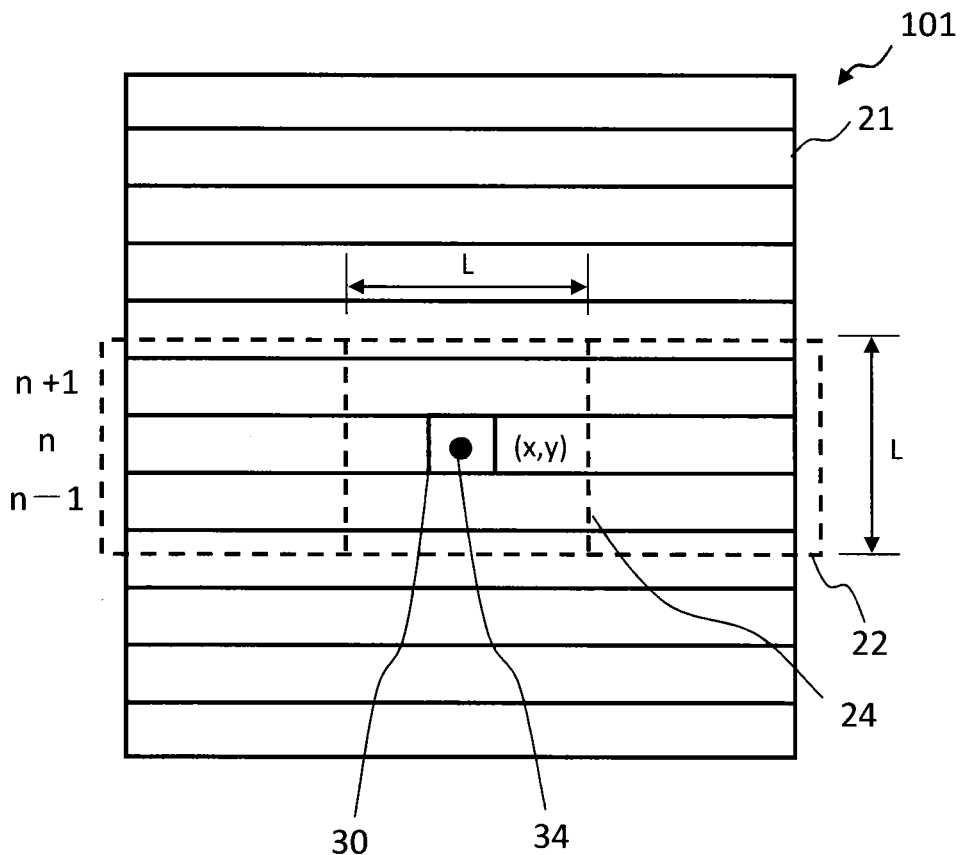
FIG. 10 shows an example of a frame region and a positional deviation calculation range according to the first embodiment.

FIG. 10 shows an example of a frame region and a positional deviation calculation range according to the first embodiment. In FIG. 10, in writing on the target object 101, while the XY stage 105 is continuously moved in the x direction, for example, multi-beams irradiate one stripe region of the target object 101, which is obtained by virtually dividing the writing (exposure) surface by the width of the multi-beam irradiation region 30 into a plurality of stripe regions each in the shape of a strip. Moreover, the stripe region is virtually divided into a plurality of mesh-like small regions (pixels) by about the beam size of each beam of multiple beams, and writing is performed for each pixel. The movement of the XY stage 105 in the X direction is a continuous movement, for example, and at the same time, the shot position of the multiple beams is made to follow the movement of the stage. In the writing apparatus 100, when layout data (writing data) is processed, the writing region is virtually divided into a plurality of frame regions 21 each in the shape of a strip, and data processing is performed for each frame region 21. For example, when multiple exposure is not performed, the frame region 21 and the stripe region mentioned above are usually the same region. When multiple exposure is performed, the frame region 21 and the stripe region become displaced from each other in accordance with multiplicity. Alternatively, the writing region is virtually divided into a plurality of frame regions 21 being the same regions as the stripe regions in accordance with multiplicity, and data processing is performed for each frame region 21. Thus, the writing region of the target object 101 is virtually divided into a plurality of frame regions 21 (stripe regions) each serving as a writing unit region, and the writing unit 150 performs writing for each frame region 21 (stripe region).

Specifically, first, the XY stage 105 is moved and adjusted such that an irradiation region (multi-beam irradiation region 30) to be irradiated with one-time irradiation of the multiple beams 20 is located at the left end of the first stripe region or at a position more left than the left end, and then writing is started. When writing the first stripe region, the writing advances relatively in the x direction by moving the XY stage 105 in the −x direction, for example. The XY stage 105 is continuously moved at a predetermined speed, for example. After writing the first stripe region, the stage position is moved in the −y direction and adjusted such that the multi-beam irradiation region 30 is located at the right end of the second stripe region or at a position more right than the right end and located to be relatively in the y direction. Then, similarly, writing advances in the −x direction by moving the XY stage 105 in the x direction, for example. That is, writing is performed while alternately changing the direction, such as performing writing in the x direction in the third stripe region, and in the −x direction in the fourth stripe region, and thus, the writing time can be reduced. However, the writing operation is not limited to the case of performing writing while alternately changing the direction, and it is also acceptable to perform writing in the same direction when writing each stripe region 21. By one shot, a plurality of shot patterns of the same number as holes of the aperture member 203 are formed at a time by multiple beams which have been formed by passing through respective corresponding holes of the aperture member 203.

For example, writing is performed, in a stripe, with multiple beams of v×w in the x and y directions. It is assumed that each pitch between beams of multiple beams is the length of p pixels in the x direction and q pixels in the y direction. In such a case, exposure (writing) of the whole of the multi-beam irradiation region 30 is completed by performing shots of p×q times while shifting the irradiation position by one pixel by one pixel in the x direction or the y direction. The continuous movement of the XY stage 105 in the x direction is followed by collectively performing deflection of the entire multiple beams by the deflector 208 such that a desired pixel position is irradiated by a corresponding beam.

In the control computer 110 that generates shot data, calculation is performed for each frame region 21 as described above. Therefore, calculations for the pattern area density distribution, dose distribution, irradiation amount distribution, and fogging electron distribution are also performed for each frame region 21. For example, when calculation for the n-th frame is being performed, calculation processing for the (n−1)th frame is performed in the deflection control circuit 170. Then, when calculation for the pattern area density distribution, dose distribution, irradiation amount distribution, and fogging electron distribution of the (n+1)th frame is being performed in the control computer 110, calculation processing for the n-th frame is performed in the deflection control circuit 170. Thus, calculation processing advances like so-called pipeline processing.

First, in the pattern area density distribution ρ(x, y) calculation step, the pattern area density distribution calculation unit 114 reads, for each frame region, corresponding layout data from the storage device 140, and, further, virtually divides the frame region into a plurality of small regions (x, y) so as to calculate a pattern area density ρ for each small region. By performing such calculation for the whole frame region, a pattern area density distribution ρ(x, y) is obtained for each frame region.

In the dose (irradiation amount density) distribution D(x, y) calculation step, the dose distribution calculation unit 116 calculates a dose distribution D(x, y) for each small region. The dose distribution D(x, y) is calculated according to a proximity effect correction equation (2) of a back scattering electron described below.

$$D = D_0 \times \{(1 + 2 \times \eta)/(1 + 2 \times \eta \times \rho)\} \quad (2)$$

(In the equation (2), $D_0$ denotes a reference dose amount and η denotes a back scattering rate.)

The reference dose amount $D_0$ and the back scattering rate η are set by the user of the writing apparatus 100. The back scattering rate η can be set in consideration of the acceleration voltage of the electron beam 200, the resist film thickness of the target object 101, the type of the base substrate, processing conditions (for example, PEB conditions and development conditions), etc.

Then, in the fogging electron distribution F(x, y, σ) calculation step, the fogging electron distribution calculation unit 118 calculates a fogging electron distribution F(x, y, σ) by using an irradiation amount distribution E(x, y) (also called an "irradiation intensity distribution") for each mesh region obtained by multiplying a pattern area density distribution ρ(x, y) by a dose amount distribution D(x, y)).

It is assumed that, with respect to the irradiation amount distribution E(x, y), there exists a function g(x, y) which describes a spread distribution of fogging electrons. The function g(x, y) is, for example, a model of a Gaussian distribution, and can be expressed by the following equation (3). σ denotes a fogging effect influence radius.

$$g(x,y)=(1/\pi\sigma^2)\times\exp\{-(x^2+y^2)/\sigma^2\} \quad (3)$$

As shown in equation (4) below, a fogging electron distribution (also called a "fogging electron intensity") F(x, y, σ) can be obtained by evaluating a convolution integral of the spread distribution function g(x, y) with the irradiation amount distribution E(x, y).

$$F(x,y,\sigma)=\iint g(x-x'',y-y'')E(x'',y'')dx''dy'' \quad (4)$$

In the charge amount distribution calculation step (S114), the charge amount distribution calculation unit 122 calculates a charge amount distribution C(x, y) that is charged by perpendicular incidence of a representative beam 34 in the writing region of the target object 101, for each frame region. Specifically, the charge amount C(x, y) of each position (x, y) is calculated in each of frame regions up to just before the frame region currently being calculated.

Here, it should be understood that, even at the same position, for example, the charge amount C of each position (x,y) in frame regions up to the (n−1)th frame region when the currently calculated frame region 21 is the n-th frame region may be different from the charge amount C of each position (x,y) in frame regions up to the n-th frame region when the currently calculated frame region 21 is the (n+1)th frame region. This is because the amount of charge is accumulated.

It is assumed that there is a function C(E, F) for obtaining a charge amount distribution C(x, y) from the irradiation amount distribution E(x, y) and the fogging electron distribution F(x, y, σ). This assumed function C(E, F) is divided into a variable $C_E(E)$ to which irradiation electrons contribute, and a variable $C_{Fe}(F)$ to which fogging electrons contribute, as shown in the following equation (5).

$$C(E,F)=C_E(E)+C_{Fe}(F) \quad (5)$$

Further, the function of a non-irradiation region is assumed to be a variable $C_E(E)=0$, that is $C(E, F)=C_F(F)$.

First, the relation between the charge amount distribution $C_F(F)$ of a non-irradiation region and the fogging electron intensity F can be expressed by a polynomial function as shown in the following equation (6). In the equation (6), $f_1$, $f_2$, and $f_3$ are constants.

$$C_F(F)=f_1\times F+f_2\times F^2+f_3\times F^3 \quad (6)$$

Next, the charge amount distribution C(E, F) of an irradiation region can be defined by a polynomial function as shown in the following equation (7).

$$C(E, F) = C_E(E) + C_{Fe}(F) \quad (7)$$
$$= (d_0 + d_1 \times \rho + d_2 \times D + d_3 \times E) +$$
$$(e_1 \times F + e_2 \times F^2 + e_3 \times F^3)$$

Here, F is a fogging electron distribution of the irradiation region obtained by the equation (4) using the optimal fogging radius σ. Not only the variable $C_E(E)$ to which irradiation electrons contribute but also the charge amount distribution $C_{Fe}(F)$ to which fogging electrons contribute are taken into consideration in the irradiation region. Parameters $d_0$, $d_1$, $d_2$, $d_3$, $e_1$, $e_2$, and $e_3$ are constants.

Then, the charge amount distribution C(x, y) is obtained by a sum set of $C_F(F)$ of the equation (6) for a non-irradiation region and C(E, F) of the equation (7) for an irradiation region.

As described above, the charge amount distribution C(x, y) is calculated for each frame region. The calculated charge amount distribution C(x, y) for each frame region is stored in the storage device 146, etc. Thus, when performing writing processing for the n-th frame, the charge amount distribution C(x, y) for up to the (n−1)th frame has already been stored.

In the pixel position correction step (S116) for perpendicular incidence of a representative beam, the offline charge correction application unit 126 inputs a positional deviation correction value dX0(x, y), dY0(x, y) from the storage device 146, and calculates a pixel position (Xm', Ym') after correcting charge, using the positional deviation correction value obtained when off-line, based on the pixel position (Xm, Ym) to be a writing target of the n-th frame. The pixel position (Xm', Ym') after the charge correction can be calculated by the following equation (8).

$$Xm'=Xm+dX0(Xm,Ym), Ym'=Ym+dY0(Xm,Ym) \quad (8)$$

In the charge amount distribution cutout step (S118), the charge amount distribution cutout unit 124 cuts out a partial charge amount distribution Csub(x, y) of the calculation range from the charge amount distribution C(x, y) which has already been calculated, and outputs it to the deflection control circuit 170. As explained with reference to FIGS. 6 and 9, the calculation range of the first embodiment can be narrower by using the difference table δr[i, j](x, y) than the case of using the positional deviation response table r0(x, y). For example, in the case of FIG. 6, while the calculation range is 40 mm (=20 mm(radius)×2) when the positional deviation response table r0(x, y) is used, it can be reduced to L=27 mm (=13.5 mm (radius)×2) when the difference table δr[i, j](x, y) is used. Therefore, what is necessary is to cut out the charge amount distribution C(x, y) of the frame region located in the range of the width L before and after the frame region 21 concerned, as a partial charge amount distribution Csub(x, y). For example, when the pixel position (Xm', Ym') of the n-th frame is being calculated, the charge amount distribution C(x, y) of a frame located in the range of L/2 from the n-th frame, in the frames up to the (n−1)th frame should be cut out. There is no data for the (n+1)th frame and its subsequent frames because of not having been calculated yet.

In the pixel corrected position acquisition step (S120) for perpendicular incidence of a representative beam, the pixel position acquisition unit 172 acquires, as an input, the pixel position (Xm', Ym') after the charge correction for perpendicular incidence of a representative beam, from the control computer 110.

In the stage position acquisition step (S122), the stage position acquisition unit 174 acquires, as an input, the stage position (XL, YL) in writing the pixel position (Xm, Ym) serving as a writing target, from the stage position detection unit 136.

In the multi-beam block-division position identification step (S124), the block-division position calculation unit 176 calculates a block position (i, j) (block grid division index) in order to identify which block position (i, j) in the multi-beam irradiation region is irradiated by a corresponding beam of multiple beams.

Figure 11:
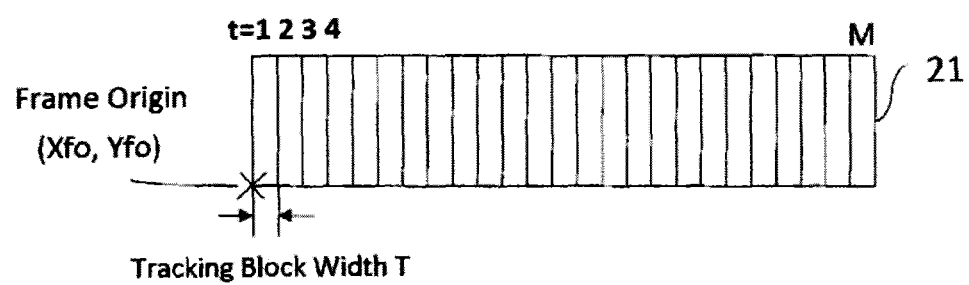
FIG. 11 illustrates the state in which a frame region is divided by a tracking block width, according to the first embodiment.

FIG. 11 illustrates the state in which a frame region is divided by a tracking block width, according to the first embodiment. Unlike the case of a single beam, the unit for real time correction for multiple beams is not a subfield but a tracking block unit. As shown in FIG. 11, the frame region 21 is divided by a tracking block width T, which is 10 μm, for example. In the case of FIG. 11, the tracking block number is named t=1, 2, 3, . . . , M in order from the left. The origin of the frame region 21 shall be (Xfo, Yfo).

Figure 12:
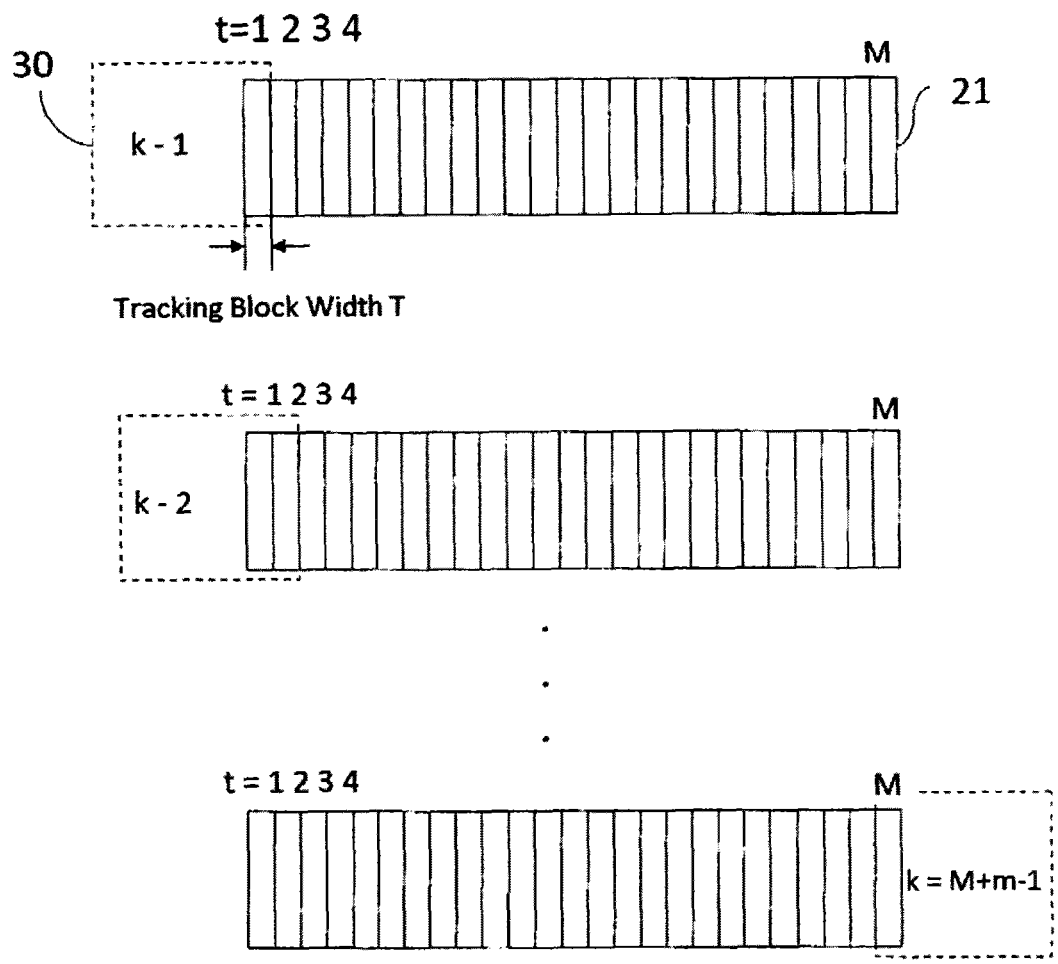
FIG. 12 shows a tracking block and a multi-beam irradiation region according to the first embodiment.

FIG. 12 shows a tracking block and a multi-beam irradiation region according to the first embodiment. The value obtained by dividing the multi-beam irradiation region 30 by the tracking block width T is defined to be m. If the dimension of the multi-beam irradiation region 30 is 80 μm large, m will be 8. At this time, the number of times of tracking (tracking times number) required for writing the whole frame region 21 is (M+m−1) times. The tracking times number is defined to be k=1, 2, 3, . . . , (M+m−1).

The number of dividing the multi-beam irradiation region into multi-beam block-divisions 11 in the case of FIG. 8 shall be N. At this time, the multi-beam block-division number i and the multi-beam block-division number j (0≤i<N, 0≤j<N) are defined by the following equation (9).

$$t = \mathrm{trunc}((Xm'-Xfo)/T)+1 \quad (9)$$

$$i = \mathrm{trunc}((m+t-k-1)/(m/N))$$

$$j = \mathrm{trunc}((Ym'-Yfo)/(mT/N))$$

The function trunc( ) indicates "round down to an integer". Specifically, as shown in FIG. 8, assuming N=4, when m=8, the value of "i" with respect to each tracking block number t and tracking times number k is represented as shown in the table of FIG. 13.

FIG. 13 shows examples of the multi-beam block-division number corresponding to the tracking block number and the tracking times number according to the first embodiment. Since the multi-beam block-division number j in the y direction is not dependent upon the tracking block number t and the tracking times number k, the table for it is omitted. FIG. 13 shows the case where the direction of writing is +X (FWD direction), that is, the direction of the stage movement is −X direction. However, if in the case where the direction of writing is −X (BWD direction), that is, the direction of the stage movement is +X direction, the same equation as the equation (9) and the table described above can be applied as long as the tracking times number k is followed in reverse order, from the largest one to the smallest one.

In the difference table selection step (S126), first, the difference table transmission unit 120 (transmission unit) transmits a plurality of difference tables δr[i, j](x, y) stored in the storage device 142 to the deflection control circuit 170. Then, the difference table selection unit 178 (selection unit) selects one of a plurality of difference tables δr[i, j](x, y), having been transmitted and stored in the storage device 142, in accordance with a block position (i, j).

In the calculation region determination step (S128), the region determination unit 180 inputs a partial charge amount distribution Csub(x, y), and determines a calculation range, in the input partial charge amount distribution Csub(x, y), to perform a convolution integral by using the selected difference table δr[i, j](x, y). In FIG. 10, a square range which centers the position (x, y) concerned and whose each side length is L in frame regions 22 in the range of the partial charge amount distribution Csub(x, y) is determined as a calculation range 24. As has been explained with reference to FIGS. 6 and 9, the calculation range can be narrower by using the difference table δr[i, j](x, y) than the case of using the positional deviation response table r0(x,y). In the case of FIG. 6, for example, while the calculation range is 40 mm (=20 mm(radius)×2) when the positional deviation response table r0(x, y) is used, it can be reduced to L=27 mm (=13.5 mm(radius)×2) when the difference table δr[i, j](x, y) is used. Therefore, the calculation range 24 can be narrowed.

In the block position dependence correction value calculation step (S130), the corrected position calculation unit 182 calculates an irradiation position dependence correction value (dXij, dYij) for correcting a remaining positional deviation amount (third positional deviation amount) dependent upon irradiation position, obtained by subtracting a second positional deviation amount for perpendicular incidence of a representative beam from a first positional deviation amount at each block position (i, j), by using a charge amount distribution (in this case, the partial charge amount distribution Csub(x, y)). The first positional deviation amount is a positional deviation amount of a block position due to the amount of charge, at each block position (i, j) in the multi-beam irradiation region. The second positional deviation amount is a positional deviation amount of an irradiation position due to the amount of charge, caused by perpendicular incidence of a representative beam. The corrected position calculation unit 182 is an example of an irradiation position dependence correction value calculation unit. The corrected position calculation unit 182 calculates an irradiation position dependence correction value (dXij, dYij) by using one difference table δr[i, j](x, y) selected from a plurality of difference tables δr[i, j](x, y). Since a positional deviation amount dependent on an irradiation position can be calculated by convolving a difference table δr[i, j](x, y) with the partial charge amount distribution Csub(x, y), a correction value (dXij, dYij) can be obtained by inverting the sign (positive/negative) of the positional deviation amount dependent on an irradiation position, as shown in the equation (10) below. The symbol "·" in the equation (10) denotes a convolution integral.

$$(dXij, dYij) = -\delta r[i,j](x,y) \cdot \mathrm{Csub}(x,y) \quad (10)$$

In the position correction step (S131), the position correction unit 183 calculates a corrected position (Xm', Ym') by adding an irradiation position dependence correction value (dXij, dYij) to a pixel position (Xm', Ym'), as shown in the following equation (11).

$$Xm''=Xm'+dXij, Ym''=Ym'+dYij \quad (11)$$

Thus, the position correction unit 183 calculates a corrected position by adding an irradiation position dependence correction value to a perpendicular incidence corrected position having been corrected using a perpendicular incidence correction value for correcting a second positional deviation amount of a block position (irradiation position) due to the amount of charge, resulting from perpendicular incidence of a representative beam.

The pixel position (Xm', Ym') becomes a perpendicular incidence corrected position for which a positional deviation caused by perpendicular incidence has been corrected as described above. The pixel position (Xm', Ym') is a value having been corrected using a correction value map dX(x, y), dY(x, y) (or maps dX(x, y) and dY(x, y)) that corrects the second positional deviation amount of an irradiation position due to the charge amount C, resulting from perpendicular incidence of a representative beam. The correction value map dX(x, y), dY(x, y) (or maps dX(x, y) and dY(x, y)) is perpendicular incidence correction values for correcting a positional deviation caused by perpendicular incidence, as described above.

That is, the position correction unit 183 calculates, using the charge amount distribution C, a corrected position (Xm", Ym") of each pixel position where a positional deviation amount including a positional deviation amount of an irradiation position due to the amount of charge, dependent on the irradiation position of each beam of multiple beams, has been corrected. Thereby, a positional deviation amount including a positional deviation amount of an irradiation position due to the amount of charge, dependent on the irradiation position of each beam of multiple beams, can be corrected.

In the irradiation amount calculation step (S132), the irradiation amount calculation unit 184 calculates an irradiation amount of each beam so that the formation position of an irradiation pattern of each beam of multiple beams may be a corresponding corrected position respectively.

Figure 14:
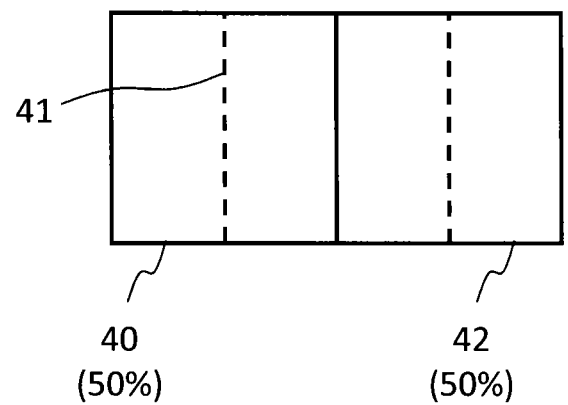
FIG. 14 illustrates a method for correcting a pixel position according to the first embodiment.

FIG. 14 illustrates a method for correcting a pixel position according to the first embodiment. For example, normally, a pixel 40 is irradiated by a beam A of multiple beams. At this time, if irradiation is performed using 100% of a planned irradiation amount, an irradiation pattern is formed by the beam A on the pixel 40. If, for performing correction so that the position of the pixel 40 may be shifted to a next pixel 42 side by 50% of the pixel size, the pixel 40 is irradiated by the beam A by using 50% of the planned irradiation amount, and the pixel 42 is irradiated by a beam B by using 50% of the planned irradiation amount. Thereby, an irradiation pattern is formed on a pixel 41 which is the intermediate position of the pixel 40 and the pixel 42. Thus, by controlling the irradiation amount of each beam, the formation position of an irradiation pattern of each beam of multiple beams can be corrected to be a corresponding corrected position.

In the writing step (S134), the writing unit 150 writes a pattern on the target object 101 by controlling the irradiation amount of each beam so that the formation position of the irradiation pattern of each beam of multiple beams may be a corresponding corrected position respectively. Specifically, the writing unit 150 writes a pattern on the target object by using a corresponding beam of multiple beams such that an irradiation pattern is formed at the corrected position (Xm", Ym") of a pixel concerned of the n-th frame of the target object 101.

After writing of the n–th-frame has been completed, calculation for writing the next (n+1)th frame and writing processing are to be performed similarly. That is, when calculating the corrected position (Xm", Ym") of the pixel in the (n+1)th frame, since the calculation of the charge amount distribution C up to the n-th frame has been completed, what is to be done is to sequentially update each information on the pattern area density distribution ρ, the dose distribution D, the irradiation amount distribution E, the fogging electron distribution F, and the charge amount distribution C.

As described above, according to the first embodiment, positional deviation of an irradiation position due to the charge amount can be corrected taking irradiation position dependence of multiple beams into consideration. Accordingly, writing is performed at a highly precise correction position. Thus, a highly precise pattern position can be obtained.

In the above description, processing contents or operation contents of what is expressed by the term "unit" or "step" can be configured by a computer operable program. Alternatively, they may be implemented by a program being software, or a combination of hardware and software, or further, by a combination of hardware and firmware. When configured by a program, the program is stored in a recording medium, such as a magnetic disk drive, magnetic tape drive, FD, or ROM (Read Only Memory). For example, the program is stored in the storage device 142, 144, or 146.

The control computer 110 of FIG. 1 or the like may be connected, through a bus (not shown), to a storage device, such as an RAM (Random Access Memory), a ROM, and a magnetic disk (HD) drive, to an input unit, such as a keyboard (K/B) and a mouse, to an output unit, such as a monitor and a printer, or to an input/output unit, such as an external interface (I/F), FD, DVD, CD, etc.

Referring to specific examples, Embodiments have been described above. However, the present invention is not limited to these specific examples. For example, although a multi charged particle beam writing apparatus is used in Embodiments, the present invention is applicable to other typewriting apparatus. Further, for example, although an electron beam is used in the above Embodiments, the present invention is not limited to it and also applicable to the case using other charged particle beam, such as an ion beam. Moreover, the present invention does not limit the purpose of usage of an electron beam writing apparatus. For example, in addition to the purpose of usage of forming a resist pattern directly on a mask or a wafer, the electron beam writing apparatus can also be used when forming a mask for an optical stepper, an x-ray mask, or the like.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other multi charged particle beam writing apparatus and multi charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
   a charge amount distribution calculation unit configured to calculate a charge amount distribution of a target subject based on a result of perpendicular incidence of a selected beam of multiple beams in a writing region of the target object;
   a position correction unit configured to calculate, using the calculated charge amount distribution, a corrected irradiation position of each beam of the multiple beams to compensate positional deviation of the each beam from formation positions due to charges on the target object as a result of the selected beam; and
   a writing unit configured to write a pattern on the target object including controlling irradiation of the each beam based on the corrected irradiation positions.

2. The apparatus according to claim 1, further comprising:
   an irradiation position dependence correction value calculation unit configured to calculate an irradiation position dependence correction value based on a position of the each beam in a multi-beam irradiation region, wherein the position correction unit calculates the corrected irradiation position by adding the irradiation position dependence correction value to a perpendicular incidence corrected position calculated based on the charge amount distribution.

3. The apparatus according to claim 2, further comprising:
a storage device configured to store a plurality of difference response functions each indicating a difference between a first response function for calculating a first positional deviation amount of the each beam of the multiple beams at a respective position in the multi-beam irradiation region, and a second response function for calculating the perpendicular incidence corrected position,
wherein the irradiation position dependence correction value calculation unit calculates the irradiation position dependence correction value by using one of the plurality of difference response functions.

4. The apparatus according to claim 3, further comprising:
a selection unit configured to select one of the plurality of difference response functions, in accordance with the respective position in the multi-beam irradiation region,
wherein the irradiation position dependence correction value calculation unit calculates the irradiation position dependence correction value by using the selected one of the plurality of difference response functions.

5. The apparatus according to claim 1, further comprising:
a storage device configured to store layout data including figure data; and
a pattern area density distribution calculation unit configured to calculate a distribution of a pattern area density in each mesh region, for each frame region of a plurality of frame regions obtained by virtually dividing the writing region of the target object into mesh-like regions by a predetermined dimension, based on the figure data included in the layout data stored in the storage device.

6. The apparatus according to claim 5, further comprising:
a dose distribution calculation unit configured to calculate a dose amount distribution by using a proximity effect correction equation of a back scattering electron.

7. The apparatus according to claim 6, further comprising:
a fogging electron distribution calculation unit configured to calculate a distribution of a fogging electron amount, based on a distribution of an irradiation amount of an electron beam obtained based on the distribution of the pattern area density and the distribution of the dose amount, and a function describing a spread of fogging electrons.

8. The apparatus according to claim 7, wherein the charge amount distribution calculation unit calculates a charge amount of each position in each of frame regions up to just before a frame region currently being written.

9. The apparatus according to claim 1, further comprising:
a charge amount distribution cutout unit configured to cut out a partial charge amount distribution in a calculation range from the calculated charge amount distribution.

10. A multi charged particle beam writing method comprising:
calculating a charge amount distribution of a target subject based on a result of perpendicular incidence of a selected beam of multiple beams in a writing region of the target object;
calculating, using the calculated charge amount distribution, a corrected irradiation position of each beam of the multiple beams to compensate positional deviation of the each beam from formation positions due to charges on the target object as a result of the selected beam; and
writing a pattern on the target object including controlling irradiation of the each beam based on the corrected irradiation positions.

11. A multi charged particle beam writing apparatus comprising:
a charge amount distribution calculation means for calculating a charge amount distribution of a target subject based on a result of perpendicular incidence of a selected beam of multiple beams in a writing region of the target object;
a position correction means for calculating, using the calculated charge amount distribution, a corrected irradiation position of each beam of the multiple beams to compensate positional deviation of the each beam from formation positions due to charges on the target object as a result of the selected beam; and
a writing means for writing a pattern on the target object including controlling irradiation of the each beam based on the corrected irradiation positions.

* * * * *